United States Patent
Murooka

[11] Patent Number: 5,355,099
[45] Date of Patent: Oct. 11, 1994

[54] SIGNAL GENERATING DEVICE

[75] Inventor: Fumio Murooka, Kanagawa, Japan

[73] Assignee: Canon Kabushiki Kaisha, Tokyo, Japan

[21] Appl. No.: 904,206

[22] Filed: Jun. 25, 1992

[30] Foreign Application Priority Data

Jul. 2, 1991 [JP] Japan .................. 3-161519

[51] Int. Cl.$^5$ ............................................. H03B 5/32
[52] U.S. Cl. ........................................ 331/158; 331/77
[58] Field of Search ............ 331/116 FE, 158, 116 R, 331/74, 77

[56] References Cited

U.S. PATENT DOCUMENTS

| | | | |
|---|---|---|---|
| 4,553,110 | 11/1985 | Kleinberg | 331/116 FE |
| 4,906,948 | 3/1990 | Quievy | 331/158 |
| 5,063,358 | 11/1991 | Vale et al. | 331/116 R |

FOREIGN PATENT DOCUMENTS 59-211888  11/1984  Japan .................. 331/158

*Primary Examiner*—Andrew M. Dolinar
*Attorney, Agent, or Firm*—Robin, Blecker Daley & Driscoll

[57] ABSTRACT

A signal generating device according to the present invention is a device for generating a signal. The device includes a crystal oscillating element and an inverter connected in parallel with the crystal oscillating element. The device is arranged to adjust the amplitude of a signal produced at an input side of the inverter and to capacity-couple the signal produced at the input side of the inverter to an amplifier circuit so that the signal produced at the input side of the inverter is amplified. Accordingly, it is possible to realize a simple construction which includes a reduced number of terminals, which is suited to high-density mounting or is suitably formed as an integrated circuit, and which can be easily reduced in cost.

5 Claims, 2 Drawing Sheets

SIGNAL GENERATING DEVICE

BACKGROUND OF THE INVENTION

1. Field of the Invention

The present invention relates to a signal generating device for generating a signal and, more particularly, to a signal generating device for generating a carrier signal for use in down-converting a chrominance signal.

2. Description of the Related Art

A carrier signal generating device is known as one example of a signal generating device for generating a signal. The carrier signal generating device is arranged to generate a carrier signal used in the down-conversion of a chrominance signal which is performed for recording a standard color television signal on a video tape in a video tape recorder.

FIG. 1 is a block diagram schematically showing the arrangement of a chrominance signal down-converting circuit provided with a conventional carrier signal generating device.

As shown in FIG. 1, a chrominance signal ($f1 = 3.58$ MHz) inputted through an input terminal 14 is frequency-converted in a frequency converter 15 by using a carrier signal ($f2 = 4.32$ MHz) generated from the carrier signal generating device 11.

The frequency converter 15 outputs the chrominance signal whose frequency has been converted into a frequency ($f2 \pm f1$) to a band-pass filter (BPF) 17 over a signal line 16. The BPF 17 extracts a signal of frequency $f2 - f1 = 743$ KHz from the input chrominance signal and outputs the extracted signal through an output terminal 18.

The carrier signal ($f2 = 4.32$ MHz) is required to be a signal of single frequency free from high-frequency components of second order or higher. Accordingly, as shown in FIG. 1, a trap circuit 13 made up of a ceramics filter or the like is used to eliminate such high-frequency components from the carrier signal generated from the carrier signal generating device 11 provided with a crystal oscillator. After the high-frequency components have been eliminated from the carrier signal by the trap circuit 13, the carrier signal is supplied to the frequency converter 15.

As described above, in the conventional circuit, the carrier signal generating device 11 provided with the crystal oscillator is employed to generate the carrier signal having a stable single frequency. However, since the carrier signal outputted from the carrier signal generating device 11 contains a distortion due to the characteristics of the carrier signal generating device 11 itself, the trap circuit 13 needs to be added for eliminating such a distortion.

However, since the trap circuit 13 is made up of, for example, a ceramics filter, it is difficult to form the trap circuit 13 as a small-size element. This disadvantage hinders implementation of high-density mounting and cost reduction. In addition, if the carrier signal generating circuit 11 and the frequency converter 15 are to be formed as an integrated circuit, it is necessary to provide a terminal 12 for connection with the trap circuit 13 and the total number of terminals must be increased.

SUMMARY OF THE INVENTION

It is, therefore, an object of the present invention to provide a signal generating device which makes it possible to solve the above-described problems.

Another object of the present invention is to provide a signal generating device having a simple arrangement which includes a reduced number of terminals, which is suited to high-density mounting or is suitably formed as an integrated circuit, and which can be easily reduced in cost.

To achieve the above objects, in accordance with one aspect of the present invention, there is provided a signal generating device for generating a signal, which comprises a crystal oscillating element, an inverter connected in parallel with the crystal oscillating element, amplitude adjusting means for adjusting an amplitude of a signal produced at an input side of the inverter, capacity-coupling means for providing capacity-coupling of the signal produced at the input side of the inverter, and an amplifier circuit for amplifying a signal supplied via the capacity-coupling means.

The above and other objects, features and advantages of the present invention will become apparent from the following detailed description of a preferred embodiment of the present invention, taken in conjunction with the accompanying drawings.

DETAILED DESCRIPTION OF THE PREFERRED EMBODIMENT

A preferred embodiment of the present invention will be described below with reference to the accompanying drawings.

Figure 2:
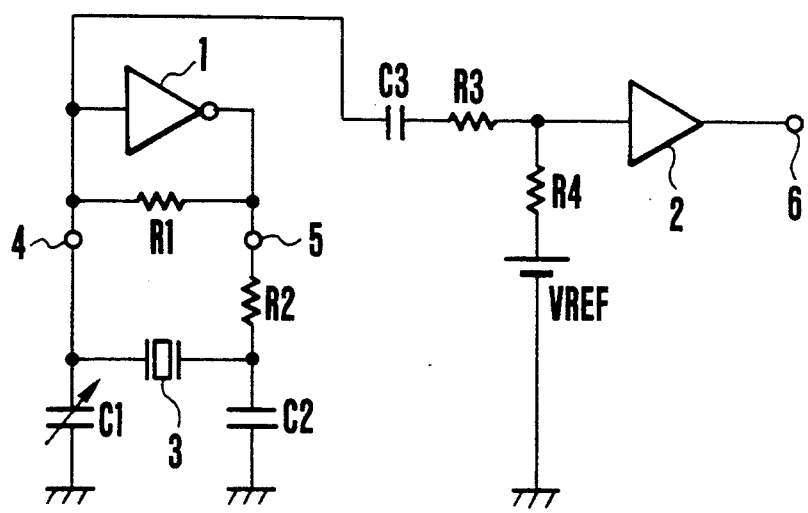
FIG. 2 is a diagram showing the circuit arrangement of a carrier signal generating device to which one embodiment of the present invention is applied.
Figure 3:
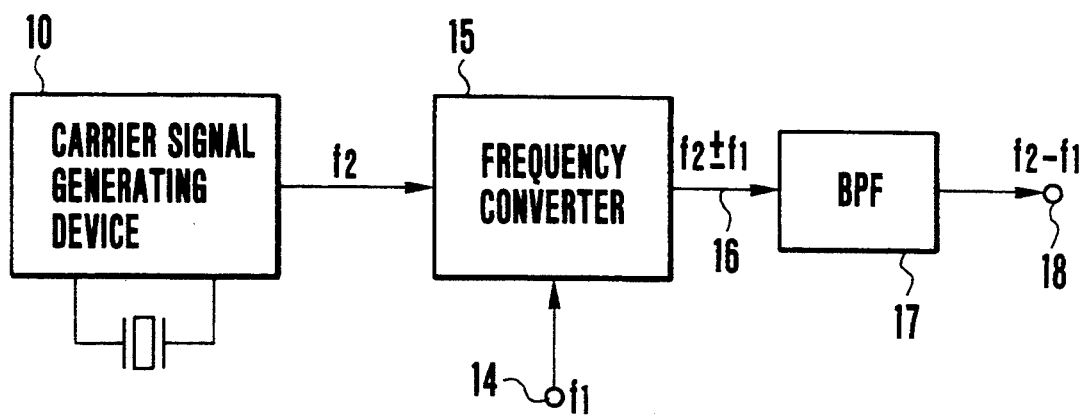
FIG. 3 is a block diagram schematically showing the circuit arrangement of a chrominance signal down-converting circuit provided with the carrier signal generating device shown in FIG. 2.

FIG. 2 is a diagram showing the circuit arrangement of a carrier signal generating device to which one embodiment of the present invention is applied. FIG. 3 is a block diagram schematically showing the circuit arrangement of a chrominance signal down-converting circuit provided with the carrier signal generating device shown in FIG. 2.

Figure 1:
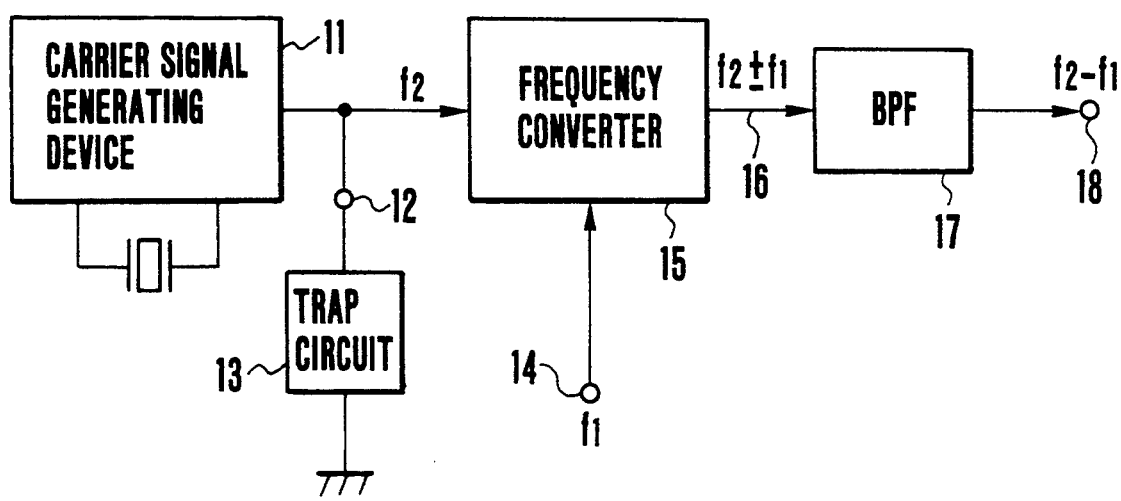
FIG. 1 is a block diagram schematically showing the arrangement of a chrominance signal down-converting circuit provided with a conventional carrier signal generating device.

In FIG. 3, the same reference numerals are used to denote elements which are substantially identical to the elements shown in FIG. 1, and a detailed description is omitted.

The circuit arrangement shown in FIG. 2 includes an inverter 1 having a CMOS or Bi-CMOS construction, a feedback resistor R1, a crystal oscillator 3, a trimmer capacitor C1 for adjusting an oscillation frequency, a load capacitance C2, and a resistor R2 for adjusting the amplitude of a signal produced at the input side of the inverter 1.

Normally, a signal waveform appearing at an output terminal 5 of the inverter 1 is a rectangular waveform, and a sine-wave signal of single frequency which is determined by the resonant frequency of the crystal oscillator 3 is produced at an input terminal 4 of the inverter 1.

The frequency of the sine-wave signal can be adjusted chiefly by the trimmer capacitor C1, and the amplitude of the sine-wave signal can be freely adjusted by selecting the value of the resistor R2 and that of the load capacitance C2 within the range of source voltages of the inverter 1.

As described above, the sine-wave signal produced at the input terminal 4 of the inverter 1 is supplied to an amplifier 2 through a coupling capacitor C3. The sine-wave signal which has been amplified by the amplifier 2 is supplied via an output terminal 6 to the frequency converter 15 shown in FIG. 3 (the carrier signal generating device shown in FIG. 2 corresponds to a block 10 of FIG. 3).

If it is assumed that the input impedance of the amplifier 2 is high to a negligible extent and that the respective values of the coupling capacitor C3 and the resistors R3 and R4 are represented as the relationship $f2 >> 1/(2\pi C3(R3+R4))$, the amplitude of the sine-wave signal produced at the input terminal 4 of the inverter 1 is attenuated to a level represented by $R4/(R3+R4)$. The thus obtained signal is supplied to the amplifier 2.

The input operating point of the amplifier 2 may be determined by the voltage level VREF shown in FIG. 2, and the resistance ratio of the resistor R3 to the resistor R4 may be determined by the range of input voltages of the amplifier 2. The gain and the output operating point of the amplifier 2 may be determined so that optimum interface conditions can be realized with respect to the next-stage frequency converter 15.

If the coupling capacitor C3 is composed of, for example, a MOS capacitor which is formed as part of an integrated circuit, a terminal of the capacitor may be connected so that a parasitic capacitance occurring between the coupling capacitor C3 and ground can be produced at the input terminal 4 of the inverter 1.

As described above, according to the present embodiment, it is possible to generate a carrier signal for use in frequency-converting a chrominance signal without eliminating a high-frequency component by means of a trap circuit in the conventional manner. Accordingly, if a carrier signal generating device and a frequency converting circuit are to be formed as an integrated circuit, the number of terminals or external elements can be reduced so that it is possible to reduce the size and cost of an integrated-circuit mounting substrate.

As is apparent from the foregoing description, according to the present embodiment, it is possible to provide a signal generating device which includes a reduced number of terminals, which is suited to high-density mounting or is suitably formed as an integrated circuit, and which can be easily reduced in cost.

What is claimed is:

1. A signal generating device for generating a signal, comprising:
    (A) a crystal oscillating element;
    (B) an inverter connected in parallel with said crystal oscillating element;
    (C) amplitude adjusting means for adjusting an amplitude of a signal produced at an input side of said inverter;
    (D) capacity-coupling means for providing capacity-coupling of the signal produced at the input side of said inverter;
    (E) a level adjusting circuit for adjusting a level of the signal fed through said capacity coupling means; and
    (F) an amplifier circuit for amplifying the signal having its level adjusted by said level adjusting circuit and for outputting the amplified signal.

2. A signal generating device according to claim 1, wherein said crystal oscillating element includes a variable capacitor for adjusting an oscillation frequency.

3. A signal generating device according to claim 1, wherein said inverter includes an inverter element having a CMOS or Bi-CMOS construction.

4. A signal generating device according to claim 1, wherein said amplitude adjusting means includes a capacitor and a resistor.

5. A signal generating device according to claim 1, wherein said capacity-coupling means includes a coupling capacitor.

* * * * *